United States Patent [19]
Gardner et al.

[11] Patent Number: 5,543,736
[45] Date of Patent: Aug. 6, 1996

[54] GATE ARRAY ARCHITECTURE AND LAYOUT FOR DEEP SPACE APPLICATIONS

[75] Inventors: Harry N. Gardner; Charles R. Gregory; Douglas W. Garvie, all of Colorado Springs, Colo.

[73] Assignee: United Technologies Corporation, Hartford, Conn.

[21] Appl. No.: 165,236

[22] Filed: Dec. 10, 1993

[51] Int. Cl.⁶ .......................... H01L 25/00; H03K 19/00
[52] U.S. Cl. ...................... 326/101; 326/13; 257/206
[58] Field of Search ..................... 307/443, 465, 307/465.1; 257/206, 390–391; 437/48, 51, 61; 326/9, 10, 13, 21, 47, 50, 101

[56] References Cited

U.S. PATENT DOCUMENTS

| | | | |
|---|---|---|---|
| 4,623,911 | 11/1986 | Pryor | 257/206 |
| 4,633,571 | 1/1987 | Kolwicz | 437/34 |
| 4,727,266 | 2/1988 | Fujii et al. | 307/443 |
| 4,745,084 | 5/1988 | Rowson et al. | 437/51 |
| 4,851,892 | 7/1989 | Anderson et al. | 257/206 |
| 5,060,046 | 10/1991 | Shintani | 257/206 |
| 5,175,605 | 12/1992 | Pavlu et al. | 307/443 |

*Primary Examiner*—Edward P. Westin
*Assistant Examiner*—Jon Santamauro
*Attorney, Agent, or Firm*—Ozer M. N. Teitelbaum

[57] ABSTRACT

The present invention teaches an integrated circuit ("IC") gate array having improved reliability and increased immunity to deep space interference from electromagnetic radiation, photon energy, and charged particles. In one embodiment of the present invention, the gate array comprises a first and a second logical component, and a first and a second isolation transistor. Both first and second isolation transistors comprise an input, a biasing bus having a voltage potential, and an electrical contact for electrically coupling the biasing bus with the input. Moreover, the gate array comprises a redundant coupling for increasing the immunity of the gate array to charged particles, electromagnetic radiation and photon energy.

5 Claims, 5 Drawing Sheets

GATE ARRAY ARCHITECTURE AND LAYOUT FOR DEEP SPACE APPLICATIONS

FIELD OF THE INVENTION

This invention relates to the field of integrated circuits, and more particularly to a gate array architecture having improved reliability and increased immunity to charged particles, photon energy and electromagnetic radiation for deep space applications.

BACKGROUND OF THE INVENTION

In the semiconductor industry, gate arrays are employed as customized integrated circuit devices. Implementing electrical logic functions, gate arrays realize AND, NAND, OR, and NOR gates, as well as combinations of these gate functions to form latches, flip flops, and adders, for example.

In order to customize specific electrical logic functions on a semiconductor substrate, complementary metal oxide semiconductor ("CMOS") gate arrays typically comprise a base array of a plurality of P type and a plurality of N type transistors. Both P and N type transistors are arranged in columns, enabling customization by intra and inter logical connections. These connections allow electrical current to pass between interconnected transistors. Further, these connectors are usually formed by one or more metal mask layers.

Traditionally, gate arrays are formed on a semiconductor substrate having drain-source diffusion regions. It should be noted that for the purposes of the present invention, source and drain are interchangeable, particularly in light of the physics of field effect transistor ("FET") devices. These drain-source regions are sufficiently spaced apart and insulated from one another to enable the formation of a gate region. As disclosed in U.S. Pat. No. 4,620,270, commonly assigned with the present invention and incorporated herein by reference, by this arrangement, a chain of continuously electrically connected transistors can be formed. The drain of each transistor of the series is thus electrically coupled to the source of an adjacent transistor. As such, logical functions can be realized by electrical coupling selected transistors from the chain.

Once customized, industry practice is to employ some means to increase the level of reliability of the customized IC. As such, positioned between each logically realized element is an isolation transistor. Isolation transistors functional purpose is to isolate each logical element from the IC's remaining components. Comprising a gate, source and drain, the isolation transistors gate is coupled to a voltage source or ground, depending on the transistor type, and thereby made inactive. Thus, for example, if the isolation transistor is an N type, the gate is coupled to ground, while if isolation transistor is a P type, the gate is coupled to $V_{dd}$ or $V_{cc}$.

Figure 1:
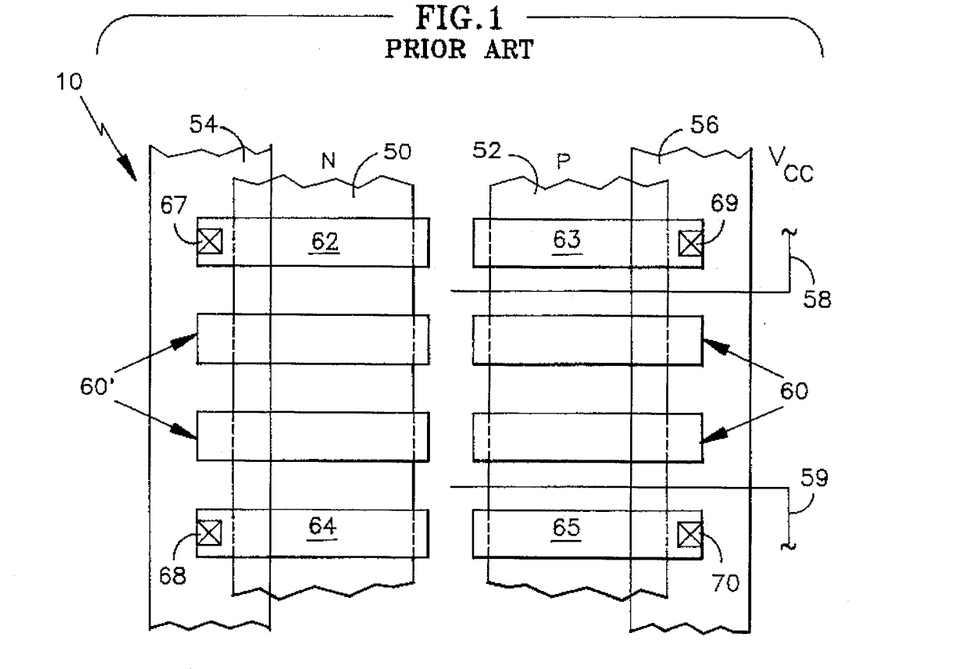
FIG. 1 is a planar view of a known logic module having an isolation transistor.

Referring to FIG. 1, a layout is illustrated of a known logic module or integrated circuit ("IC") having several isolation transistors formed on a semiconductor substrate 10. Substrate 10 comprises two diffusion regions, 50 and 52, to form a chain of N channel and P channel transistors, respectively. Adjacent to both N and P diffusion regions are a first and second bus, 54 and 56. First bus 54, neighboring N diffusion region 50, is directly coupled to ground. In contrast, adjacent to P diffusion region is second bus 56, which is directly coupled to a power supply.

At the center of the logic module are a two sets of two transistors, 60 and 60'. These transistors, 60 and 60', are employed for the purposes of forming the intended logic element, such as a dual inverter for example. As discussed above, this logic element is realized by particular interconnects. The realized logic element also comprises an input and an output interconnect, 58 and 59.

Further, isolation transistors, 62, 63, 64, and 65, of the logic module are provided for the purpose of isolating the logic element from the extraneous effects of neighboring logic elements. To this end, the gates of isolation transistors 62 and 64—which are N channel devices—are coupled to ground bus 54 by means of electrical contacts 67 and 68, respectively. In contrast, the gates of isolation transistors 63 and 65—which are P channel devices—are coupled to power bus 56 by means of electrical contacts 69 and 70, respectively. Electrical contacts, 67–70, are formed by extending a conventional contact from the gate of their respective isolation transistors to the metallization layer bus.

Given this configuration, isolation transistors, 62–65, are permanently disabled. This is achieved by the coupling of the isolation transistors' gates to either ground or power supply. Thus, no signals can pass from neighboring circuits to the logic unit represented by transistors 60 and 60'.

The coupling of isolation transistors, 62–65, to their respective buses, 54 and 56, is achieved by means of a conventional contact, as described above. In standard applications and environments, the potential for the conventional contact to open is within some degree of certainty and has a measurable rate of failure.

Furthermore, it has been observed that in the presence of charged particles, photon energy, or electromagnetic radiation, such as in deep space applications, the reliability of gate arrays employing a traditional CMOS architecture has been suspect. A potential failure mechanism exists specifically in the case of the conventional open contact. Under these circumstances, the bombardment of a semiconductor may cause charged particles to migrate to the isolation transistor gate. Further, if the gate is not coupled to its power bus, the voltage induced may cause the gate to change its gate potential and turn on or become conductive, thereby eliminating the isolation between transistors in the column. Thus, a solution is required to improve the reliability of known gate array architectures in a photon energy, electromagnetic radiation or charged particle environment.

SUMMARY OF THE INVENTION

The primary advantage of the present invention is to provide a gate array having an increased immunity to electromagnetic radiation, photon energy, and charged particles.

Another advantage of the present invention is to provide an customized integrated circuit having improved reliability.

A further advantage of the present invention is to provide a customized integrated circuit best suited for deep space environments.

In order to achieve the advantages of the present invention, an integrated circuit ("IC") gate array is disclosed having improved reliability and increased immunity to deep space interference from electromagnetic radiation, photon energy, and charged particles. In a first embodiment of the present invention, the gate array comprises an N and a P diffusion region formed within a semiconductor substrate and substantially spaced apart to avoid latchup. Further, the gate array comprises a first and a second logical component, and a first and a second isolation transistor for isolating the first logical component from the second logical component. Both first and second isolation transistors comprise an input, a biasing bus having a voltage potential, and an electrical contact for electrically coupling the biasing bus with the input. The biasing bus of the first isolation transistor is positioned adjacent to the N diffusion region and electrically coupled to an electrical ground, while the biasing bus of the second isolation transistor is positioned adjacent to the P diffusion region and electrically coupled to a power supply. Moreover, the gate array comprises a redundant coupling for increasing the immunity of the gate array to charged particles, electromagnetic radiation and photon energy. The redundant coupling is employed on at least one selected isolation transistor from both the first and second isolation transistors and provides a redundant electrical link between the input and the biasing bus of the selected isolation transistor. If one connection should fail, the second connection has a high probability of remaining operative, thus improving the overall reliability of the isolation.

In the preferred embodiment of the present invention, the selected isolation transistor of the first embodiment comprises a gate, a source, and a drain, wherein the input is the gate. Further, the redundant coupling of the first embodiment is positioned at an overlap between the gate and the biasing bus of the selected isolation transistor. The N and P diffusion regions both comprise a plurality of drain-source region pairs and a plurality of insulating regions positioned between each of the drain-source region pairs. Moreover, the gate of the selected isolation transistor comprises a strip of conductive material having a first and second end. The strip is positioned directly superjacent an insulating region of the plurality. The electrical contact, additionally, is positioned at the first end of the strip. The redundant coupling further comprises a global bus having a voltage potential substantially within the range of the voltage potential of the biasing bus of the selected isolation transistor. The global bus is positioned between the N and P diffusion regions. The redundant coupling also comprises a first electrical joint at the second end, thereby electrically coupling the global bus with the gate. Furthermore, the redundant coupling comprises a second electrical joint as well. The second electrical joint is positioned at the biasing bus, thereby electrically coupling the gate with the biasing bus of the selected isolation transistor.

In a further embodiment of the present invention, an integrated circuit ("IC") gate array is disclosed having increased immunity to deep space interference from electromagnetic radiation, photon energy, and charged particles. In this embodiment, the gate array comprises an N and a P diffusion region formed within a semiconductor substrate and substantially spaced apart to avoid latchup. Further, the gate array comprises a first and a second logical component, and a first and a second isolation transistor for isolating the first logical component from the second logical component. Both first and second isolation transistors comprise an input, a biasing bus having a voltage potential, and an electrical contact for electrically coupling the biasing bus with the input. The biasing bus of the first isolation transistor is positioned adjacent to the N diffusion region and electrically coupled to an electrical ground, while the biasing bus of the second isolation transistor is positioned adjacent to the P diffusion region and electrically coupled to a power supply. Moreover, in this embodiment, the gate array comprises a redundant isolation transistor for increasing the immunity of the gate array to charged particles, electromagnetic radiation and photon energy. The redundant isolation transistor is electrically coupled with at least one selected isolation transistor of the first and second isolation transistors.

In a further embodiment of the present invention, a method of increasing the immunity of an integrated circuit gate array to deep space interference from electromagnetic radiation, photon energy, and charged particles is disclosed. The gate array comprises an N and a P diffusion region formed within a semiconductor substrate though substantially spaced apart to avoid latchup. Further, both these N and P diffusion regions comprise a plurality of drain-source region pairs. The gate array also comprises a first and a second logical component, and a first and a second isolation transistor for isolating the first logical component from the second logical component. Both first and second isolation transistors comprise a gate, a source, and a drain, wherein the gate comprises a strip of conductive material having a first and second end. An additional oxide isolated region is retrofitted to the existing oxide mask. The new mask adds an oxide strip, positioned directly superjacent an insulating region of the plurality of insulating regions positioned between each of the drain-source pairs, to isolate the source and drain regions and thereby provide additional redundancy. Further, both isolation transistors comprise a biasing bus having a voltage potential, wherein the biasing bus of the first isolation transistor is adjacent to the N diffusion region and electrically coupled to an electrical ground, while the biasing bus of the second isolation transistor is adjacent to the P diffusion region and electrically coupled to a power supply. Moreover, the isolation transistors comprise an electrical contact for electrically coupling the biasing bus with the gate, and the electrical contact is positioned at the first end of the strip. Given this structure, the present method comprising the steps of first selecting one of the first and second isolation transistors. Subsequently, the method comprises the step of decoupling the input from the biasing bus.

In a further embodiment, an integrated circuit gate array is disclosed having increased immunity to deep space interference from electromagnetic radiation, photon energy, and charged particles. The gate array comprises a first and second logical component. The first logical component comprises a first set of operational transistors, while the second logical component comprises a second set of operational transistors. Each operational transistor of the first and second set comprises a gate, a source, and a drain. Further, the gate array comprises a set of redundant transistors for insuring the operation of a selected logical component of the first and second logical components. Each redundant transistor of the set comprises a gate, a source, and a drain, such that each operational transistor of the selected logical component is mirrored by and coupled with a redundant transistor of the set.

Other aspects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limited embodiments, with reference to the attached drawings, wherein below:

FIG. 2A is a planar view of the first embodiment of the present invention, while

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 2A:
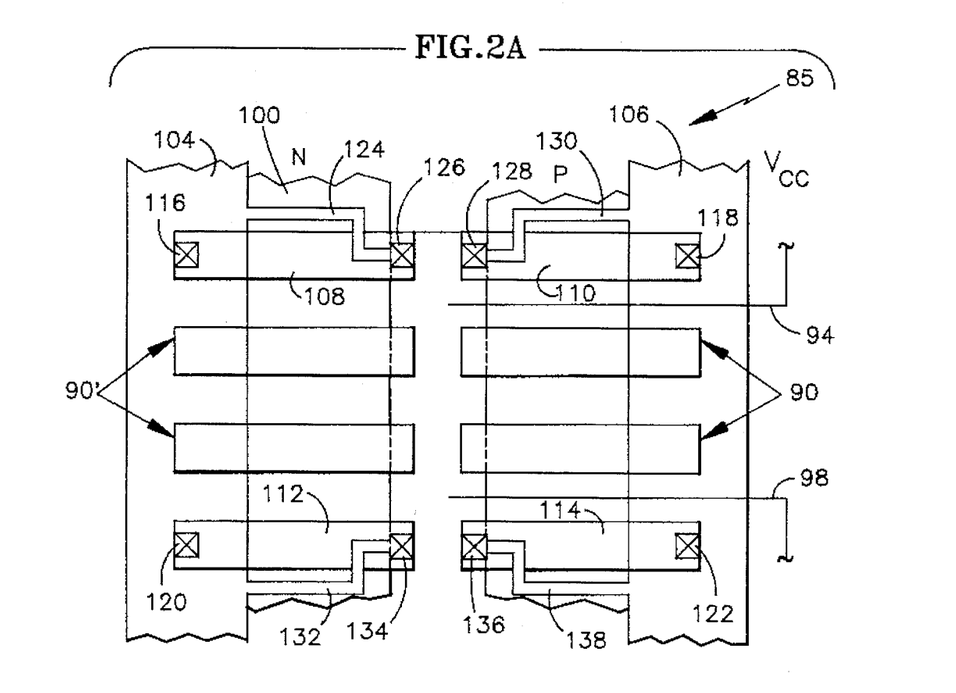

Referring to FIG. 2A, a layout is provided of an integrated circuit gate array 85 illustrating the first embodiment of the present invention. Here, an N and a P diffusion region, 100 and 102, are formed within a semiconductor substrate and employed to form a chain of N channel and P channel transistors, respectively. The N and P diffusion regions are also substantially spaced apart to avoid latchup.

Both N and P diffusion regions comprise a plurality of drain source pairs. Each drain source pair comprise an insulating region, of a plurality insulating regions, positioned between each drain source region pairs. Furthermore, adjacent to both N and P diffusion regions, 100 and 102, are a first and second biasing bus, 104 and 106, respectively. First bus 104, which neighbors N diffusion region 100, is coupled to an electrical ground, thus an approximate voltage potential of ground. Second bus 106 is coupled to a power supply, being adjacent to P diffusion region 102. Hence, the second bus 106 is approximately set to the power supply voltage.

At the center of the gate array 85 are a set of four—two N and two P channel—transistors, 90 and 90'. These four functional transistors, 90 and 90', are provided for the purpose of forming an intended first logical element by additional wiring and interconnects not shown. Once properly wired, the realized logical element comprises both an input and an output interconnect, 94 and 98. It should be noted that a second and a third logical element, not shown, are provided directly above as well as below the first logical element.

Moreover, a set of four isolation transistors, 108, 110, 112, and 114 are provided on the gate array for the purpose of isolating the realized logical element from the extraneous effects of neighboring and/or interconnected logical elements. These isolation transistors are completed by fabricating an input or gate over each drain source pair. The gate is formed by positioning a strip of conductive material, such as polysilicon, superjacent that transistor's insulating region. The gates of both N channel isolation transistors, 108 and 112, are both coupled to first bus 104 by means of electrical contacts 116 and 120, respectively. Likewise, the gates of both P channel isolation transistors, 110 and 114, are both coupled to second bus 106 by means of electrical contacts 118 and 122, respectively.

Given this structural layout, to increase its immunity to deep space interference from electromagnetic radiation, photon energy, and charged particles, the gate array 85 further comprises at least one redundant coupling, 124, 130, 132, or 138. The redundant coupling is employed to provide a redundant electrical coupling between the input of a selected isolation transistor and its biasing bus. The redundant coupling, 124, 130, 132, or 138, is electrically coupled to the selected isolation transistor and its gate by means of a conductive layer and a first electrical joint, 126, 128, 134, or 136, located at the gate. Each employed conductive layer is constructed having a second electrical joint making contact with that isolation transistor's biasing bus.

Therefore, by this structural arrangement, should an electrical contact, 116, 118, 120 or 122, of isolation transistor, 108, 110, 112 or 114, become open by means of a reliability failure, such as a charged particle, electromagnetic interference, or photon energy, the additional redundant coupling, 126, 128, 134 or 136, maintains the operational range intended of the now open isolation transistor.

Figure 2B:
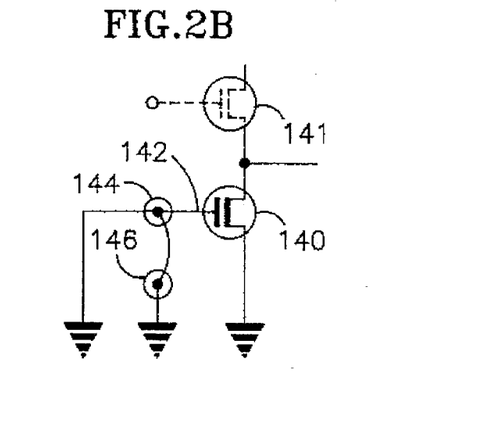
FIG. 2B depicts a circuit schematic of this embodiment.

Referring to FIG. 2B, a circuit diagram is depicted of the first embodiment. An isolation transistor 140, comprising a gate 142, drain and source, is shown coupled with a transistor 141. The gate of isolation transistor 142 is coupled to ground through node 144. Node 144 corresponds with contact 116, 118, 120 or 122 in FIG. 2A. From this perspective, a redundant coupling 146 also links node 144 to ground. Thus, in the event node 144 becomes an open circuit in view of charged particles, electromagnetic radiation or photon energy, gate 142 is still grounded by means of redundant coupling 146.

Figure 3A:
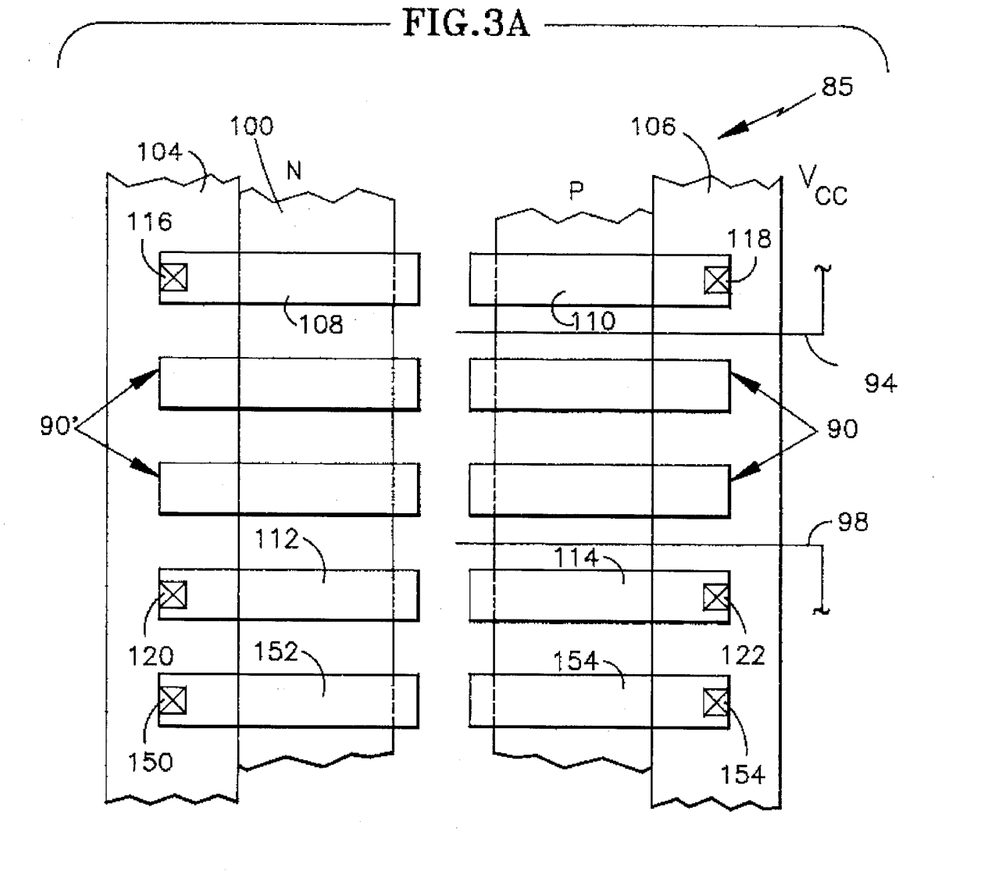
FIG. 3A is a planar view of the second embodiment of the present invention.

Referring to FIG. 3A, a layout is provided of an integrated circuit gate array 85 illustrating a second embodiment of the present invention. Here, as described herein above, gate array 85 comprises four functional transistors 90 and 90' which are provided for the purpose of forming an intended first logical element by additional wiring and interconnects not shown. Further, directly above and below the four transistors, in both N and P diffusion regions 100 and 102, are isolation transistors 108, 110, 112 and 114. The gates of both functional and isolation transistors are coupled to their respective biasing buses by the means described herein.

Unlike the first embodiment, in the present embodiment, a redundant isolation transistor has been added to increase the immunity of gate array 85 to deep space interference from electromagnetic interference, photon energy and charged particles. With respect to FIG. 3A, two redundant isolation transistors, 152 and 154, are shown. However, any number of redundant isolation transistors may be employed.

Redundant isolation transistor, 152 or 154, is electrically coupled with an adjacent isolation transistor, 112 or 114, respectively, by means of their common drain source regions. Further, redundant isolation transistor, 152 or 154, is electrically coupled to the biasing bus, 104 or 106, of its adjacent isolation transistor, 112 or 114. This coupling is achieved by the gate of the redundant isolation transistor, 152 or 154, and through an electrical joint, 150 or 156, which is in electrical contact with its respective bus, 104 or 106.

Therefore, by this structural arrangement, should an electrical contact, 120 or 122, of an adjacent isolation transistor, 112 or 114, become open due to a reliability failure, such as a charged particle, electromagnetic interference, or photon energy, the additional redundant isolation transistor, 152 or 154, maintains the operational range intended of the now open gate, adjacent, isolation transistor, 112 or 114.

Figure 3B:
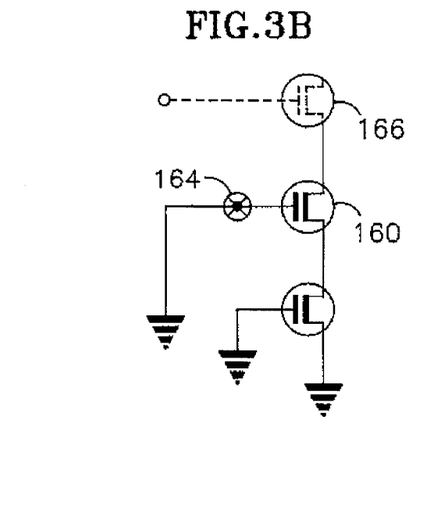
FIG. 3B depicts a circuit schematic of this embodiment.

Referring to FIG. 3B, a circuit diagram of the second embodiment is depicted. An adjacent isolation transistor 160, comprising a gate, drain and source, is shown coupled with a functional transistor 166. The gate of adjacent isolation transistor 160 is coupled to ground through node 164. Node 164 corresponds with contact 150, or 156 in FIG. 3A. Coupled by means of their common drain source regions are adjacent isolation transistor 160 and a redundant isolation transistor 162. Comprising a gate source and drain, the gate of redundant isolation transistor 162 is coupled to the biasing bus—in this case ground—of adjacent isolation transistor 160.

Thus, in the event node 164 becomes an open circuit in view of charged particles, electromagnetic radiation or photon energy, redundant isolation transistor 162 maintains the operation of the remaining circuit by preventing adjacent isolation transistor 160 from switching its purpose of operation.

Figure 4:
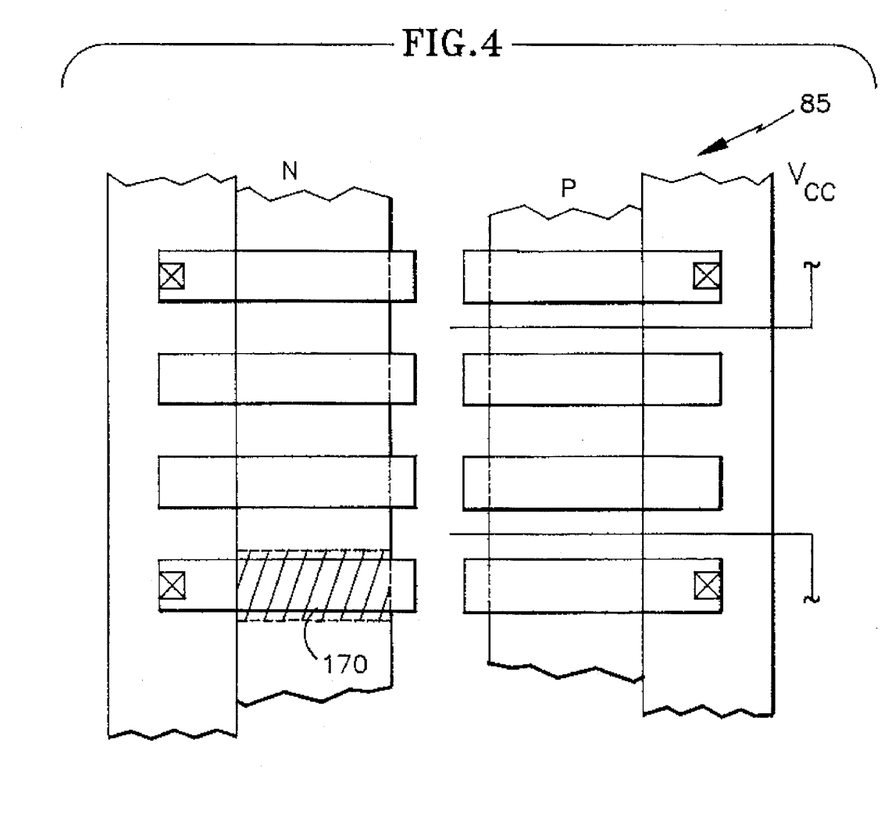
FIG. 4 is a planar view according to the third embodiment of the present invention.

Referring to FIG. 4, a layout is illustrated according to the third embodiment of the present invention. Here, a method is presented of increasing the immunity of an integrated circuit gate array to deep space interference. The method suggested can be employed on any known gate array structure, as well as the other embodiments of the present invention disclosed herein.

The method proposed comprises two essential steps. Initially, an isolation transistor is selected. Once selected, the input of the isolation transistor is decoupled from its biasing bus, thereby forming an decoupled isolation transistor 170.

The step of decoupling can be accomplished using several techniques. In one approach, the decoupling is achieved by transforming the selected isolation transistor into a substantially non-conductive dielectric device. As an end product, the dielectric device can comprise silicon dioxide. This transformation step can be realized by performing an oxide isolation cut at the point which the strip of conductive material forming the gate begins its overlap onto the biasing bus.

A second approach towards decoupling comprises two steps. First, the strip providing electrical coupling between the gate of the isolation transistor and the biasing bus is divided into a first and second member at the point which the strip of conductive material forming the gate begins its overlap on the biasing bus. Subsequently, the first member is insulated from the second member to prevent any current from passing between the biasing bus and the isolation transistor's gate.

Figure 5:
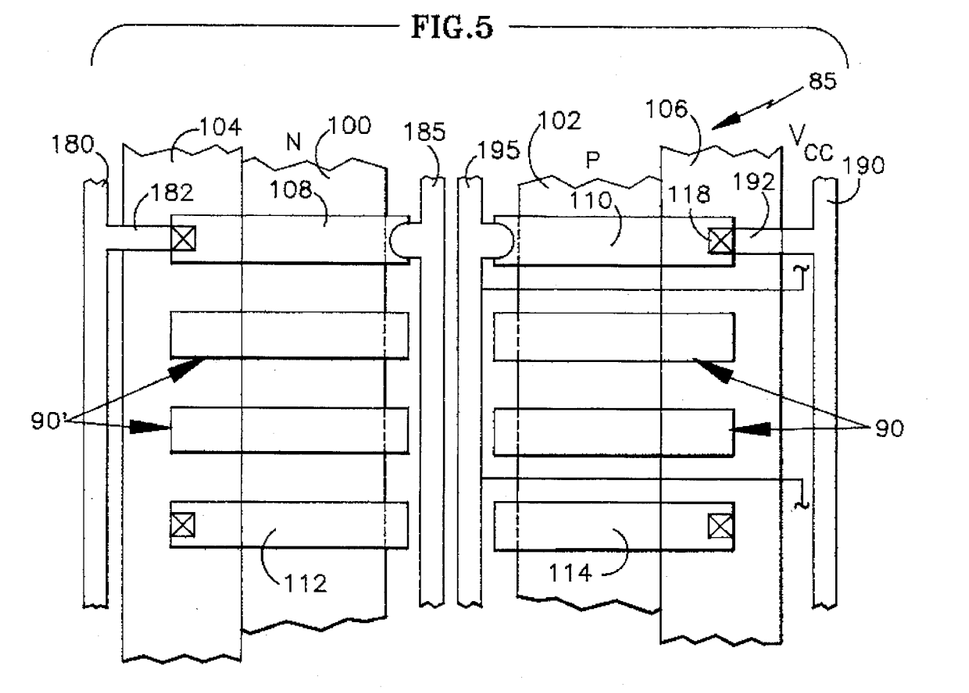
FIG. 5 is a planar view of the preferred embodiment of the present invention.

Referring to FIG. 5, a layout is provided of an integrated circuit gate array 85 illustrating the preferred embodiment of the present invention. As described herein above, gate array 85 comprises four functional transistors 90 and 90' for the purpose of forming a first logical element, achieved by additional wiring and interconnects (not shown). Further, directly above and below the functional transistors 90 and 90', in both N and P diffusion regions 100 and 102, are isolation transistors 108, 110, 112 and 114. The gates of both the functional and the isolation transistors are coupled to their respective biasing buses by the means described herein.

To improve on the immunity of the gate array architecture, the preferred embodiment comprises a pair of global buses, 180 and 190, or 185 and 195, preferably comprising polysilicon, to provide redundancy should an electrical contact, 116 or 122, of an isolation transistor, 108 or 110, become open by means of a charged particle, electromagnetic interference, or photon energy. The layout of the pair of global buses are dependent on the gate array architecture. For example, on a 1.2 micron radiation hardened gate array, given the size of the devices, sufficient space exists between the N and P diffusion regions to form global buses 185 and 195. However, on a 1.5 micron to 2.0 micron device, the spacing of the devices requires the pair of global buses, 185 and 195, to be positioned outside both N and P diffusion regions, adjacent to their respective biasing buses. In either respect, each global bus of the pair is coupled to ground or power supply; global bus 180 or 185 being coupled to ground, and global bus 190 or 195 being coupled to a power supply voltage.

It should be noted that FIG. 5 illustrates isolation transistors 108 and 110 as being electrically coupled with only one pair of global buses. Nonetheless, all four isolation transistors, as well as any one individual isolation transistor may be coupled to the global bus. Further, it should be noted that in the 1.2 micron device architecture, two pair of global buses, 180, 190, 185 and 195 could both be employed.

Under either scheme, each bus of the pair of global buses, 180 and 190, or 185 and 195, must be electrical coupled with the gate of an isolation transistor. The implementation of the electrical coupling is dependent on the layout of the pair of global buses. If the pair of global buses are positioned between the N and P diffusion regions, 100 and 102, each global bus, 185 and 195, must comprise a short electrical contact preferably realized by a polysilicon shunt. This electrical contact is positioned at the point of intersection between the gate's conductive strip and the bus itself to allow current to pass between the bus and the gate.

Figure 6:
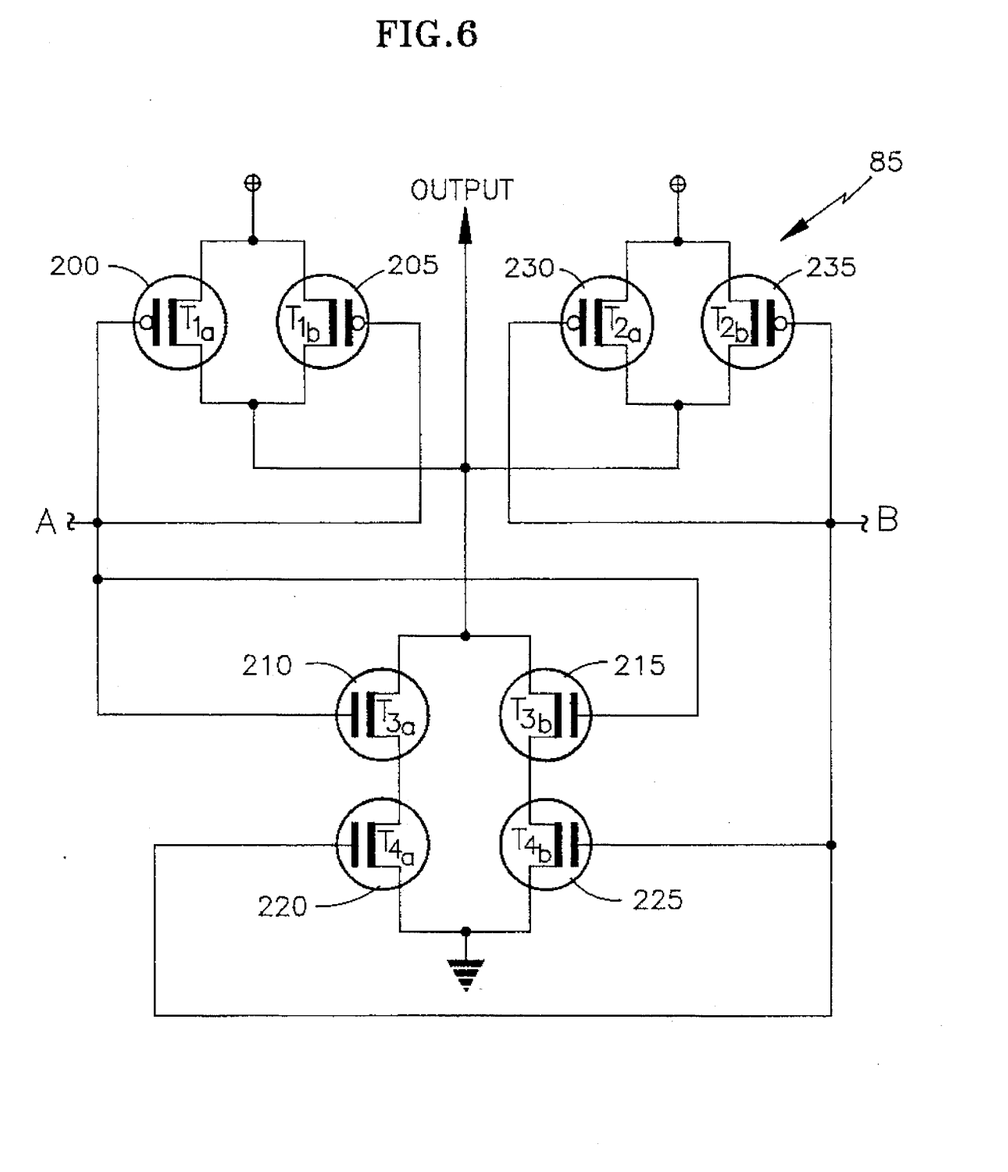
FIG. 6 is a circuit diagram of a further embodiment of the present invention.

However, if the pair of buses are positioned outside both the N and P diffusion regions, each global bus, 180 and 190, must comprise a conductive layer, 182 and 192, respectively. The conductive layers, 182 and 192, provide a means for coupling the global bus with its respective gate. With reference to FIG. 6, both conductive layers, 182 and 192, are shown making contact with isolation transistors 108 and 110 where their gates also make contact with their respective biasing buses, 104 and 106.

Referring to FIG. 6, a circuit diagram is provided of an integrated circuit gate array 85 illustrating a further embodiment of the present invention. Here, gate array 85 comprises four operational transistors, 200, 210, 220 and 230. Each operational transistor comprises a gate source and drain. The four operational transistor are interconnect to realize a logical component. In the illustrated case the logical component is a NAND gate, though this embodiment of the present invention can be applied to any logical component realization.

Gate array 85 further comprises a set of four redundant transistors, 205, 215, 225, and 235, each having a gate, source and drain. Each redundant transistor is coupled with an operational transistor. Further, each redundant transistor is mirrored by an operational transistor, such that the sources and drains of both the redundant and operational transistors are in electrical contact with each other.

Thus, in the event an operational transistor were to become electrically open in view of electromagnetic radiation, photon energy, or charged particles, that failed transistor would be substituted for by a redundant transistor. Additional redundant isolation transistors can be used as described herein to further increase the reliability of the gate array.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. Thus, while describing a gate array employing FET technology, the present invention is also applicable to any gate array structure employing any other configuration, including for example bipolar junction transistors. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. A method of increasing the immunity of an integrated circuit gate array to deep space interference from electromagnetic radiation, photon energy, and charged particles, said gate array comprising:

a semiconductor substrate;

an N diffusion region and a P diffusion region, said N and said P diffusion regions being formed within said substrate and substantially spaced apart to avoid latchup, and said N and P diffusion regions both comprise a plurality of drain-source region pairs;

a first and a second logical component;

a first and a second isolation transistor for isolating said first logical component from said second logical component, said first and second isolation transistors each being coupled with a biasing bus, said biasing bus of said first isolation transistor being adjacent to said N diffusion region and adapted to be electrically coupled to an electrical ground, said biasing bus of said second isolation transistor being adjacent to said P diffusion region and adapted to be electrically coupled to a power supply, each isolation transistor comprising:

a gate, a source, and a drain, said gate comprising a strip of conductive material having a first and second end, said strip positioned directly superjacent an insulating region of said plurality of insulating regions positioned between each of said drain-source region pairs; and an electrical contact for electrically coupling said biasing bus with said gate, said electrical contact is positioned at said first end of said strip, said method comprising the steps of:

selecting one of said first and second isolation transistors; and decoupling said gate of said one of said first and second isolation transistors from said biasing bus of said one of said first and second isolation transistors.

2. The method of claim 1, wherein said step of decoupling comprises the step of:

dividing said strip into a first and second member;

insulating said first member from said second member to prevent a current from passing from said biasing bus through said input.

3. The method of claim 1, wherein said step of decoupling comprises the step of:

transforming said selected isolation transistor into a substantially non-conductive, dielectric device.

4. The method of claim 1, wherein said dielectric device comprises silicon dioxide.

5. The method of claim 1, wherein the step of decoupling comprises the step of:

performing an oxide isolation cut on said strip.

* * * * *